(12) United States Patent
Sun et al.

(10) Patent No.: US 10,108,760 B2
(45) Date of Patent: Oct. 23, 2018

(54) SEDIMENT TRANSPORT SIMULATION WITH PARAMETERIZED TEMPLATES FOR DEPTH PROFILING

(71) Applicant: Chevron U.S.A. Inc., San Ramon, CA (US)

(72) Inventors: Tao Sun, Sugar Land, TX (US); Morgan Sullivan, Houston, TX (US); Michael James Pyrcz, Houston, TX (US); Martin Perlmutter, Houston, TX (US); Jacob Covault, Houston, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 886 days.

(21) Appl. No.: 14/478,805

(22) Filed: Sep. 5, 2014

(65) Prior Publication Data

US 2016/0070829 A1    Mar. 10, 2016

(51) Int. Cl.
   *G06G 7/48* (2006.01)
   *G06F 17/50* (2006.01)
   *G06F 17/10* (2006.01)
   *G01V 99/00* (2009.01)

(52) U.S. Cl.
   CPC ........ *G06F 17/5009* (2013.01); *G01V 99/005* (2013.01); *G06F 17/10* (2013.01)

(58) Field of Classification Search
   CPC .................................................... G06F 17/5009
   USPC ......................................................... 703/10
   See application file for complete search history.

(56) References Cited

U.S. PATENT DOCUMENTS

2011/0232913 A1    9/2011 Sun et al.

FOREIGN PATENT DOCUMENTS

WO    2006/036389    4/2006

OTHER PUBLICATIONS

PCT International Preliminary Report on Patentability, International App. No. PCT/US2015/018250, dated Mar. 16, 2017, pp. 1-8.

(Continued)

*Primary Examiner* — Hugh Jones
(74) *Attorney, Agent, or Firm* — Melissa M. Hayworth; Mary R. Bram; Marie L. Clapp

(57) ABSTRACT

Depth-averaged flow simulation systems and methods provided herein employ parameterized templates for dynamical depth profiling for at least one step of a simulation. In one illustrative computer-based embodiment, the simulation method includes, for each map point at one given time step: determining a flow template and a sediment concentration template based on depth-averaged flow velocity and depth-averaged sediment concentrations of different classes of grain size for that map point; employing the templates to construct a vertically-distributed flow velocity profile and vertically-distributed sediment concentration profiles for associated classes of grain size for that map point, thereby obtaining 3D flow velocity and 3D sediment concentration fields; using the 3D fields to calculate fluid and sediment fluxes; updating the flow velocity and sediment concentration profiles based on the divergence of the fluxes; integrating the profiles to compute updated depth-averaged flow velocity and sediment concentrations and center of gravity; and solving the depth-averaged flow equations for the next time step.

13 Claims, 5 Drawing Sheets

(56) References Cited

OTHER PUBLICATIONS

Parker, Gary, et al.; "Self-Accelerating Turbidity Currents"; J. Fluid Mech., 1986, vol. 171, pp. 145-181.
Syvitski, James P.M., et al.; "2D SEDFLUX 1.0C: An Advanced Process-Response Numerical Model for the Fill of Marine Sedimentary Basins"; Computers & Geosciences, 2001, vol. 27, No. 6, pp. 731-753.
International Search Report, dated Jul. 6, 2015, during the prosecution of International Application No. PCT/US2015/018250.
Written opinion, dated Jul. 6, 2015, during the prosecution of International Application No. PCT/US2015/018250.

SEDIMENT TRANSPORT SIMULATION WITH PARAMETERIZED TEMPLATES FOR DEPTH PROFILING

BACKGROUND

Many of today's hydrocarbon reservoirs were formed by the sedimentary depositions of fluid flows in ancient basins. The fluid flows transported the sediment, sorting and selectively depositing differently-sized grains to form sedimentary bodies with predictable geometries and properties. If such processes can be feasibly simulated with sufficient accuracy, realistic modeling of subsurface reservoirs becomes possible. The oil and gas industry desires geologic models as input to reservoir performance simulations which are used to select locations for new wells, estimate hydrocarbon reserves, and plan reservoir-development strategies. Geologic models specify key parameters (such as fluid properties and the spatial distribution of permeability) for characterizing reservoir performance, and determining the producibility of the reservoir. (For sandstone reservoirs, the spatial distribution of permeability is a function of the grain-size distribution of sands which compose the reservoir, the compartmentalization of those sands by barriers of finer grained material, and the mineralogy and burial history of the reservoir.) Models that are more realistic enable the industry to formulate more optimal production strategies The geologic modeling process can use many different types of measurement data, including but not limited to rock-property data obtained from cores, well logs, seismic data, well test and production data, and structural and stratigraphic surfaces that define distinct zones within the model space. Typically, the resolution or spatial coverage of the available measurement data is not adequate to uniquely determine the rock properties at every point in the geologic model space. Accordingly, the industry has formulated a number of approaches to filling in the missing data, including simulation of the sediment transport and deposition processes.

Such process simulation has been attempted in various ways, including: solving full 3D fluid flow equations; using reduced physics strategies and solving a set of much simpler phenomenological equations, and solving a set of 2D depth-averaged flow equations. When attempted on useful space and time resolutions at the scale of an entire reservoir and/or basin, full 3D fluid flow simulations are computationally prohibitive. The reduced physics strategies employ heuristic rules or random-walk processes to simulate sediment transport, but suffer from artifacts and numerical noise levels that limit their utility. The existing depth-averaged flow simulations may employ the classic St. Venant shallow water equations or Parker's three or four-equation turbidity current model to gain, relative to the full 3D fluid flow simulations, a significant computational advantage.

For this reason, simulations using 2D depth-averaged flow equations are widely used in many engineering applications. Yet, in the context of reservoir and/or basin modeling, many of the natural flows are highly stratified, and the degree of the stratification changes dynamically in time and space. Moreover, such stratification is a key influence on the final geometries and properties of the deposited materials. For example, the stratification of the suspended muddy materials in the flow is closely associated with the features of levee and argillaceous deposits. In existing depth-averaged flow simulation of reservoir and/or basins, the loss of flow and sediment concentration variability in the vertical direction, and their corresponding changes in time and space is expected to result in significant errors.

SUMMARY

Accordingly, there are disclosed herein a dynamically depth-averaged flow simulation systems and methods employing dynamically parameterized templates for depth profiling. Such template-based dynamic profiling enables the computational advantages of the depth-averaged flow simulation methods, particularly in terms of their computational speed, to be preserved while providing for sufficiently representative vertical variation of flow velocity and sediment concentrations and their variations in time and space.

In one illustrative computer-based embodiment, the simulation method includes, for each map point at one given time step: determining a flow template and at least one sediment concentration template based on depth-averaged flow velocity and depth-averaged sediment concentrations for that map point; employing the templates to reconstruct the 3D flow and 3D sediment concentration field by constructing a vertically-distributed flow velocity profile and vertically-distributed sediment concentration profiles for that map point using the template; calculating at each map point the flux for flow and for sediment each different class of grain size using the reconstructed 3D flow field; updating the sediment concentration profiles by computing the divergence of the sediment flux at each map point; integrating to update the depth-averaged sediment concentrations and the center of the gravity; and using these dynamically updated values to solve the depth-averaged flow equations for the flow field for the next time step. The sediment concentration profile updating operation may account for flow velocity profile, bed shear stress, erosion, sediment deposition, clear water entrainment/detrainment, and turbulent diffusion. At each point in the model the net sediment deposition may be determined at each time step and recorded for later analysis.

In another embodiment, a computer-based method for simulating evolution of a sedimentary basin comprises determining at each map point a flow template and at least one sediment concentration template based on: a depth-averaged flow velocity and one or more depth-averaged sediment concentrations for associated classes of grain size, each of said depth-averaged flow velocity and one or more depth-averaged sediment concentrations being for that map point at a given time step. The method also comprises applying at each map point the flow template to the depth-averaged flow velocity and the at least one sediment concentration template to the one or more depth-averaged sediment concentrations to obtain a vertically-distributed flow velocity profile and one or more vertically-distributed sediment concentration profiles for that map point, thereby reconstructing a 3D flow velocity field and one or more 3D sediment concentration fields for associated classes of grain size at the given time step. The method additionally comprises using the 3D flow velocity field and the one or more 3D sediment concentration fields to calculate at each map point a fluid flux and one or more sediment fluxes for associated classes of grain size. Moreover, the method comprises updating at each map point the flow velocity profile and the one or more sediment concentration profiles based on a divergence of the fluid flux and one or more divergences of the one or more sediment fluxes at that map point at the given time step. The method further comprises computing at each map point the depth-averaged flow velocity and the one or more depth-averaged sediment concentrations by integrating the flow velocity profile and the one or more sediment concentration profiles for that map point at the given time step, thereby obtaining an updated 2D flow velocity field and an updated one or more 2D sediment concentration fields. In addition, the method comprises deriving from the one or more sediment concentration profiles a center of gravity for each map point; and solving a set of two-dimensional flow equations based on the updated 2D flow velocity field, the updated one or more 2D sediment concentration fields, the center of the gravity, and flow height, to calculate, at each map point, the depth-averaged flow velocity at a next time step.

In yet another embodiment, a sedimentary basin evolution simulator system comprises: a memory having a simulator software; one or more processors coupled to the memory to execute the simulator software, the software causing the one or more processors to perform, in each of multiple time steps, operations including: determining at each map point a flow template and at least one sediment concentration template based on depth-averaged flow velocity and one or more depth-averaged sediment concentrations for associated classes of grain size, each of said depth-averaged flow velocity and one or more depth-averaged sediment concentrations being for that map point at a given time step. The operations also include applying at each map point the flow template to the depth-averaged flow velocity and the at least one sediment concentration template to the one or more depth-averaged sediment concentrations to obtain a vertically-distributed flow velocity profile and one or more vertically-distributed sediment concentration profiles for that map point, thereby reconstructing a 3D flow velocity field and one or more 3D sediment concentration fields for associated classes of grain size at the given time step. The operations further include using the 3D flow velocity field and the one or more 3D sediment concentration fields to calculate at each map point a fluid flux and one or more sediment fluxes for associated classes of grain size. The operations include recording in a nontransient information storage medium, a net sediment deposition as a function of depth at each map point, based at least in part on the flow velocity profile and one or more sediment concentration profiles at that map point at the given time step. In addition, the operations include updating at each map point the flow velocity profile and the one or more sediment concentration profiles based on a divergence of the fluid flux and one or more divergences of the one or more sediment fluxes at that map point at the given time step. The operations also include computing at each map point the depth-averaged flow velocity and the one or more depth-averaged sediment concentrations by integrating the flow velocity profile and the one or more sediment concentration profiles for that map point at the given time step, thereby obtaining an updated 2D flow velocity field and an updated one or more 2D sediment concentration fields. The operations additionally include deriving from the one or more sediment concentration profiles a center of gravity for each map point. The operations further include solving a set of two-dimensional flow equations based on the updated 2D flow velocity field, the updated one or more 2D sediment concentration fields, the center of the gravity, and flow height, to calculate at each map point the depth-averaged flow velocity at a next time step, taking the next time step as the given time step and repeating said operations of determining, applying, using, recording, updating, computing, deriving, and solving.

Figure 1:
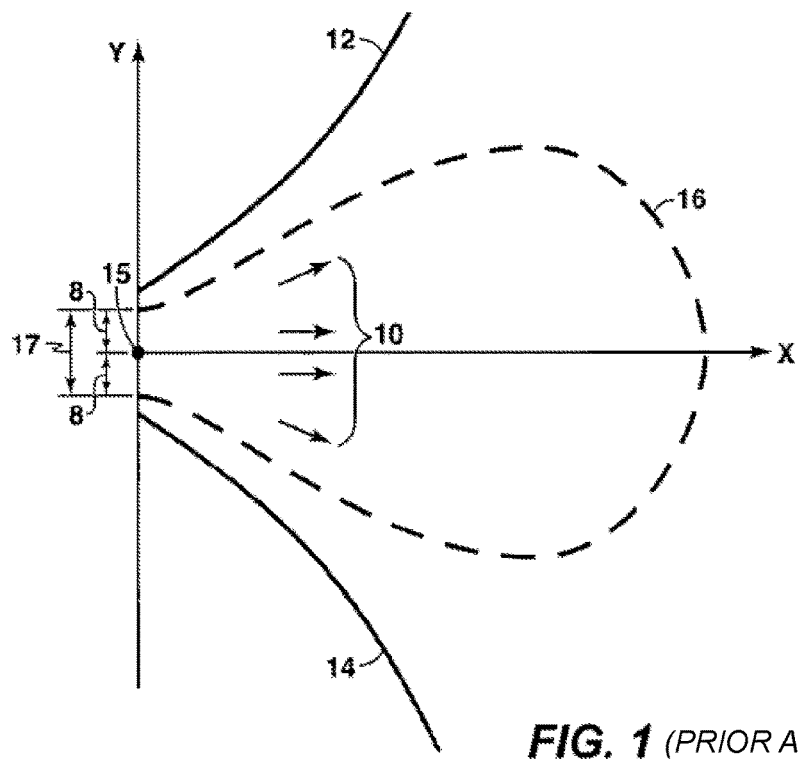
FIGS. 1 and 2 are map and elevation views of a portion of a reservoir basin model.

It should be understood, however, that the specific embodiments given in the drawings and detailed description below do not limit the disclosure. On the contrary, they provide the foundation for one of ordinary skill to discern the alternative forms, equivalents, and other modifications that are encompassed in the scope of the appended claims.

DETAILED DESCRIPTION

The complex structure of the sedimentary bodies that characterize the key heterogeneities in hydrocarbon reservoirs are directly related to the processes of transport, erosion, deposition and sorting of sediment grains of different sized in depositional systems. For example, the depositions of clastic sedimentary bodies that form deltas or basin floor fans all typically begin with a flow of sediment-laden water from a confined channel, such as a river mouth or respectively a submarine canyon mouth, into an open region, such as a open body of water for shallow fluvial systems, or respectively an abyssal plain or a deep water basin in the submarine environment. The point where the sediment-laden flow enters an open region where deposition occurs is often called the channel or canyon mouth, or simply the inlet to the corresponding depositional basin. Initially such flows expand freely and deposit sediment as the flow decelerates. Thereafter, as the deposited sediment grows in height, the deposited sediment begins to obstruct the flow field. Eventually, the deposit becomes sufficiently large that the flow is diverted around the deposit. This results in a new path and inlet for the flow field to an open region beyond or adjacent to the old deposit. The deposition process then repeats, and a second body in the system is created. As additional bodies are created, they may overlap and stack atop the preceding bodies. Multiple bodies can also be concurrently built with the system. The resulting stacks of sedimentary bodies may represent the structure of hydrocarbon reservoirs.

Dynamically depth-averaged flow simulations according to the present disclosure employ a physics-based numerical simulation of the formation and evolution of three-dimensional sedimentary deposits, their structure and rock properties. By linking the resulting stratigraphic patterns, sedimentary body geometries, and rock properties, with the associated depositional processes and the corresponding geologic controls, such simulations can reduce uncertainty in reservoir interpretation and characterization. They simulate the operation of fluid flow and sediment transport physics over the large scale and long-term evolution associated with depositional systems, successfully reproducing sedimentary structures and rock properties in high spatial resolution in three dimensions.

Based on a seismic image of a subsurface volume, the disclosed methods enable the construction of a geologic model that specifies the grain-size distribution throughout a subsurface volume. In at least some embodiments, the methods involve (1) using a physics-based numerical simulation for the calculation of fluid flow and sediment transport with given initial and boundary conditions; (2) coupling the fluid flow and sediment transport model with an appropriate erosion and deposition model to simulate the erosion and deposition of sediments of multiple sizes and properties everywhere in the system; (3) using an appropriate three-dimensional gridding scheme to record the erosion and the deposition of sediment everywhere in the system, as well as the changing topography or bathymetry of the system; (4) asserting external controls on the system by changing the boundary conditions dynamically.

FIGS. 1-4 depict various aspects of the models simulated by the disclosed methods. FIG. 1 depicts a map view of fluid flow 10 with initial or evolved flow boundaries 12 and 14. Fluid flow 10 enters the model region via an inlet 15 which is centered, for convenience, at the origin of the x and y-axes, The flow emitted from the inlet moves initially in the positive x direction. At the inlet 15, the flow has an initial width 17 and a half-width 8, which the front expand in the positive x direction. Also depicted is an outline of the deposit 16 formed by the flow.

Figure 2:
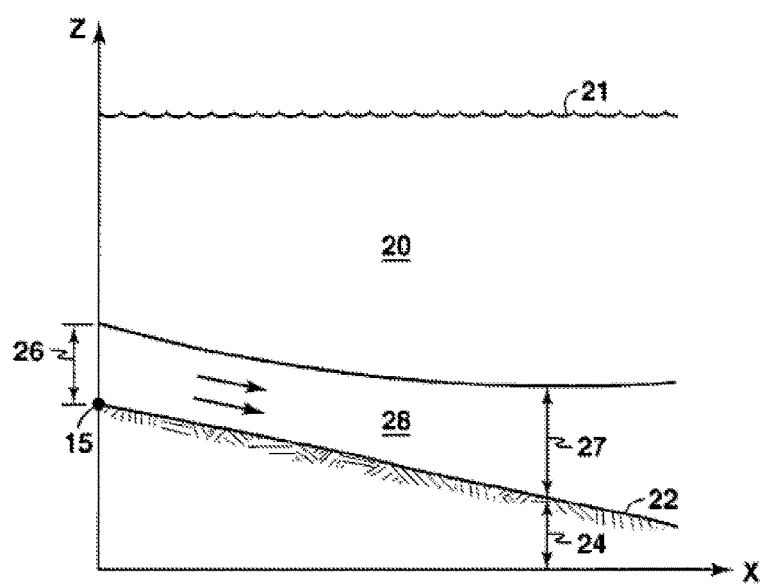

FIG. 2 depicts an elevation view taken along the x-axis of FIG. 1, showing that the fluid flow 10 is stratified into two layers. FIG. 2 illustrates the two layers of fluid as a clear layer 20 above a sediment-laden layer 28, with an upper bound provided by the sea surface 21 and a lower bound provided by the sea floor 22. The sediment-laden layer 28 is also referred to herein as the turbid water layer. The elevation of the bottom before the deposition process occurs is 24. The height of the sediment-laden water layer at inlet 15 is 26. The height of the sediment-laden water layer 28 may vary based on location, as illustrated by height 27 located at a different point further along the x-axis in FIG. 2.

Figure 3:
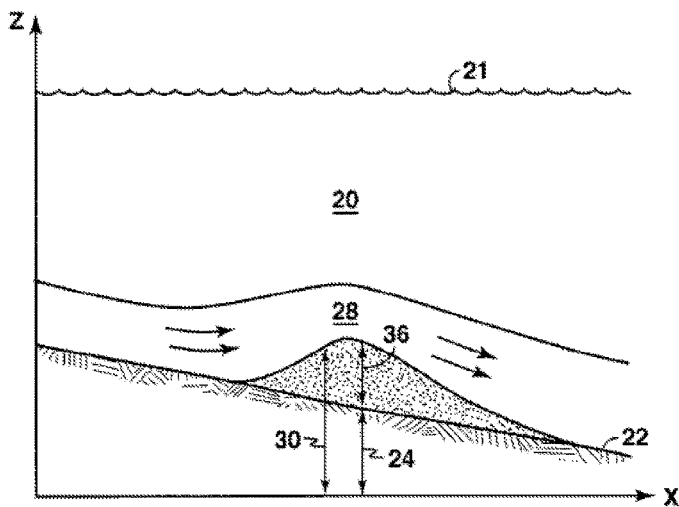
FIG. 3 is an updated elevation view of the reservoir basin model.

FIG. 3 depicts the elevation view taken along the x-axis of FIG. 1 after deposition has occurred. As in FIG. 2, the fluid flow in FIG. 3 is depicted as being comprised of clear layer 20 above a sediment-laden layer 28. The elevation of the original bottom 24 together with the thickness of the newly deposited sediment layer 36 has altered the sea floor elevation to 30.

Figure 4:
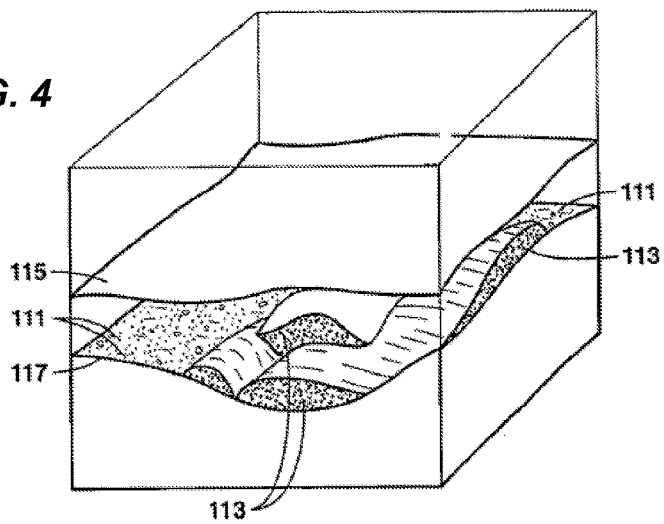
FIG. 4 is a perspective view of a reservoir basin model.

As shown in FIG. 4, the simulation operates on a three-dimensional model space to develop a picture of how sedimentary materials 111 accumulate on or otherwise affect the topography of the bottom surface 117. When the simulation is completed, the model space will contain deposited geobodies 113 and surface boundaries 115 delineating the regions having different properties. The model space may be implemented as three-dimensional array of model blocks (cells), each having assigned geologic and/or geophysical properties such as lithology, porosity, acoustic impedance, permeability, and water saturation (such properties will be referred to collectively herein as "rock properties"). The goal of the geologic-modeling process is to assign rock properties to each model block in the geologic model space. Each cell within the model space may even be associated with a history specifying the sediment types, volumes, and deposition rates, as a function of time. The resulting detailed model of the reservoir interval is suitable for estimating rock properties and production characteristics of the interval, as well as the properties of the surrounding materials and overall basin.

The simulation process includes operations in a full three dimensional domain and a two dimensional (depth-averaged) domain, and employs parameterized templates to translate from one to the other. In three dimensions, let the x-axis component of flow velocity at point (x,y,z) at time t, be denoted as u(x,y,z,t). Let the other horizontal component (along the y-axis) be denoted v(x,y,z,t). The vertical (z-axis) component of the flow velocity may be denoted as w(x,y,z,t), but it is considered insignificant and hereafter neglected (i.e., set to zero) in favor of later consideration in the form of entrainment and turbulent diffusion. Let sediment concentrations be apportioned into bins by grain diameter (with $D_i$ representing a representative diameter for the ith bin) and be denoted by $c_i(x,y,z,t)$. Such bin-apportioned concentrations may be referred to herein as "sediment concentration for a given class of grain size".

In two dimensions, let the x-axis component of the depth averaged flow velocity at point (x,y) at time t be denoted U(x,y,t). Let the y-axis component of the depth-averaged flow velocity be denoted V(x,y,t), and the depth averaged sediment concentrations for bin i be denoted $C_i(x,y,t)$. Moreover, let the flow depth be denoted h(x,y,t). The translations between two and three dimensions can then be implemented as follows:

$$u(x, y, z, t) = U(x, y, t) f_{uv}\left(U(x, y, t), V(x, y, t), C_i(x, y, t), \frac{z}{h(x, y, t)}\right), \quad (1)$$

$$v(x, y, z, t) = V(x, y, t) f_{uv}\left(U(x, y, t), V(x, y, t), C_i(x, y, t), \frac{z}{h(x, y, t)}\right), \quad (2)$$

$$c_i(x, y, z, t) = C_i(x, y, t) f_C\left(U(x, y, t), V(x, y, t), C_i(x, y, t), \frac{z}{h(x, y, t)}\right), \quad (3)$$

$$U(x, y, t) = \frac{1}{h(x, y, t)} \int_0^{h(x,y,t)} u(x, y, z, t) dz, \quad (4)$$

$$V(x, y, t) = \frac{1}{h(x, y, t)} \int_0^{h(x,y,t)} v(x, y, z, t) dz, \quad (5)$$

$$C_i(x, y, t) = \frac{1}{h(x, y, t)} \int_0^{h(x,y,t)} c_i(x, y, z, t) dz, \quad (6)$$

In equations (1)-(2) a flow template $f_{uv}(\cdot)$ is used to provide the depth-averaged flow velocity components U,V at each given time t and map point (x,y) with a z-axis dependence. That is, the flow template is applied to the depth-averaged flow velocity components to determine a vertically-distributed flow velocity profile at each time and map point. Similarly, equation (3) applies a concentration template $f_c(\cdot)$ to the depth averaged sediment concentration for each class of grain size to determine a vertically distributed sediment concentration profile for that class of grain size. (In some embodiments, the same sediment concentration template is used for each class of grain size, while other embodiments employ different sediment concentration templates for each class of grain size.)

The flow and sediment concentration templates are parameterized, i.e., they are functions of depth-averaged flow velocity (U,V), the set of depth-averaged sediment concentrations $C_i$ for grain size classes i, and optionally of flow height h and/or center of gravity for the fluid column. (In the above equations, h is merely a z-axis scaling factor rather than a parameter per se.) In addition, or as an alternative to the sediment concentrations, the templates may be functions of a depth-averaged total sediment mass, volume, or sediment concentration at that time and map point.

Each template is normalized such that it integrates along the z-axis to unity. Thus, as provided by equations (4)-(6) above, the depth averaged flow and depth averaged sediment concentrations can be obtained by a z-axis integration of the vertically-distributed profiles.

The exact shape of the templates may be derived from targeted experiments. The literature reveals that such templates may be expected to have characteristic shapes that can be readily parameterized to reflect their usage context. For example, a uniform fluid flow may be expected to have a vertically distributed flow velocity profile that follows a power law, with the exponent varying based on velocity to account for nonlinear viscosities and the onset of turbulence at higher shear stresses. As another example, the vertically-distributed sediment concentration profile (and hence the uniformity of the fluid flow) may be expected to follow a generally stratified shape with a velocity-dependent transition sharpness that reflects the increasing importance of shear-based mixing and turbulence at higher velocities. The dependences of the vertical distributions on sediment concentration and flow velocity are expected to interact in a manner that can be analyzed analytically and/or via laboratory experiment to determine suitable template shapes and sufficiently accurate parameterizations to account for the effects of flow velocity and sediment concentration on the shape of each other's vertically-distributed profiles.

Given the foregoing equations for translating between two and three dimensions, the simulation is able to employ equations for fluid flow modeling to generate a two-dimensional flow velocity field and apply parameterized templates to translate it into a three-dimensional flow velocity field. In one embodiment, the equations employed by the simulation are obtained by substituting the parameterized representations for $u(x,y,z,t)$, $v(x,y,z,t)$ and $c_i(x,y,z,t)$ into the three dimensional Navier-Stokes equation and performing z-axis integration over the flow depth h to obtain resulting a depth-averaged flow equation that can be solved to determine, time step by time step, the evolution of the flow field.

While the use of parameterized templates for the vertical distribution of flow velocities and sediment concentrations may create some differences in the equations and simulation results, the simulation may nevertheless draw upon the implementation details set forth in the literature for the use of depth-averaged flow equations. In particular, the depth-averaged flow approach is based on the work of Parker G., Fukushima, Y., and Pantin, H. M., "Self-accelerating turbidity currents", J. Fluid Mech. 171, 145-181, 1986; Bradford, S. F., "Numerical modeling of turbidity current hydrodynamics and sedimentation", PhD thesis, U. Michigan, Ann Arbor, 1996; Bradford, S. F., Katopodes, N. D., and Parker, G., "Characteristic analysis of turbid underflows", J. Hydraulic Eng. 123, 420-431, 1997; Imran, J., Parker, G., and Katopodes, N. D., "A numerical model of channel inception on submarine fans", J. Geophys. Res. 103(C1), 1219-1238, 1998; Bradford, S. F., Katopodes N. D., "Hydrodynamics of Turbid Underflows I&II", J. Hydraulic Eng. 125(10), 1006-1028, 1999; and Sun, T., et al., "Method for evaluating sedimentary basin properties by numerical modeling of sedimentation processes", U.S. Pat. No. 8,117,019 B2, 2012.

As shown in the foregoing work, the depth-averaged flow equations enforce certain conservation principles, i.e., conserving flow momentum, turbid layer volume, sediment grain mass, and (optionally) energy including turbulent kinetic energy, to determine a time derivative at each map point for depth averaged flow velocity and depth averaged sediment concentration for each class of grain size. In an embodiment, these are a set of two-dimensional flow equations. The time derivatives are then combined with the depth-averaged flow velocities and sediment concentrations from the preceding step to determine their values for the next time step. As explained further below, additional adjustments may be made to the values at each time step to account for other phenomena, then the simulation is repeated, iteratively determining values for each time step being simulated.

The foregoing work employs numerical simulation techniques that may also be employed by the simulation systems and methods disclosed here. For example, alternative gridding strategies may be employed such as the Hydro-Grid approach described in International Patent Publication No. WO 2006/007466 titled "Method for geological modeling through hydrodynamics-based gridding (Hydro-Grids)". The partial differential equation (PDE) solver employed to solve the set or group of flow equations may be chosen based in part on the numerical stability it exhibits. In particular, a Harten, Lax, van Leer ("HLL") solver may be preferred. The model space may implement a variety of boundary conditions including: dry nodes, boundary walls, and standard open boundary conditions, and may further account for the evolution of new boundaries including emerging dry nodes. The number of grain size bins is often chosen to trade off simulation speed for accuracy, relying on interpolation or dynamic adjustment of the grain size represented by each bin to mitigate the loss of accuracy.

Figure 5:
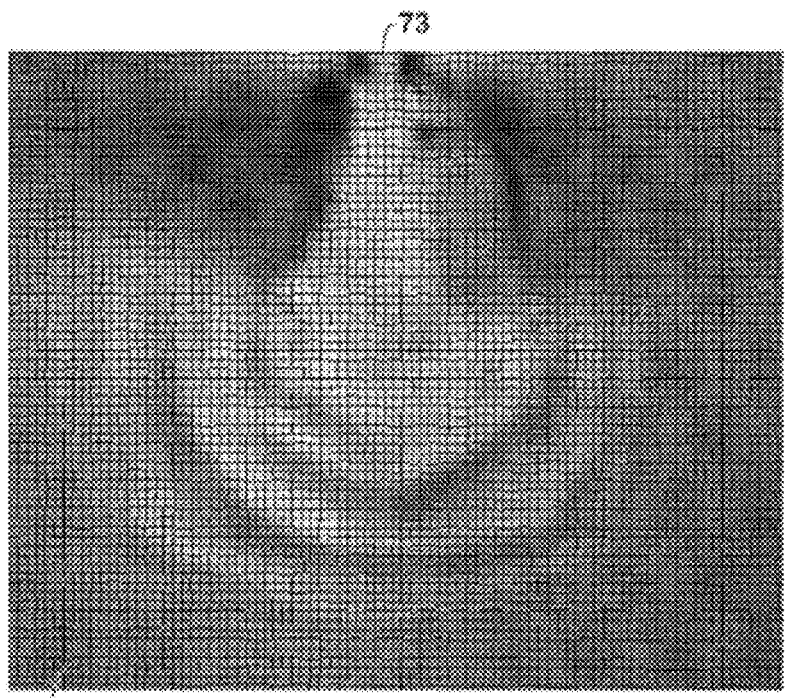
FIG. 5 is a map view of a solution to the depth-averaged flow equations.
Figure 6A:
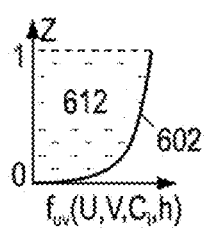
FIG. 6A show an illustrative flow and concentration template from an embodiment of the disclosed method which has near-zero velocities near the bottom and gradually increasing velocities near the top of the flow.

FIG. 5 shows an example of a depth-averaged flow velocity field that might be produced by the simulator at an arbitrary time step, using a gray scale to represent the total flow velocity in each cell. In cells far from the basin inlet (e.g., cell 71), the velocity is much lower than in the cells near the inlet (e.g., cell 73). To translate this two-dimensional depth-averaged flow velocity field into a flow field having vertical variation, the simulation applies templates. FIG. 6A shows an illustrative flow template 602 which, at the values of U, V, Ci, and h assumed for the given map point (e.g., cell 71), has near-zero velocities near the bottom and gradually increasing velocities near the top of the flow.

Figure 6B:
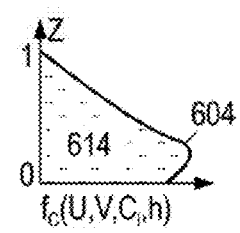
FIG. 6B show another illustrative flow and concentration template from an embodiment of the disclosed method which has sediment concentrations starting at zero and gradually increasing with depth, but for a small drop at the bottom.
Figure 6C:
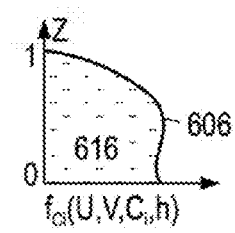
FIG. 6C show another illustrative flow and concentration template from an embodiment of the disclosed method for a specific class of grain size.

Similarly, FIG. 6B shows an illustrative sediment concentration template 604 which, at the parameter values for the given map point, has sediment concentrations starting at zero and gradually increasing with depth, but for a small drop at the bottom. As previously mentioned, some embodiments apply one sediment concentration template 604 to all grain size classes, while other embodiments apply individual sediment concentration templates to different classes of grain size. FIG. 6C shows a sediment concentration template $f_{C_i}(\cdot)$ 606 for a specific class of grain size that, when contrasted with template 604, increases much faster with depth and remains approximately steady for the bottom half of the flow. All other parameters being equal, template 606 may be more suited to small grain sizes than template 604, which may better suit large or intermediate grain sizes. The template areas 612, 614, 616, are each equal to unity.

Figure 7:
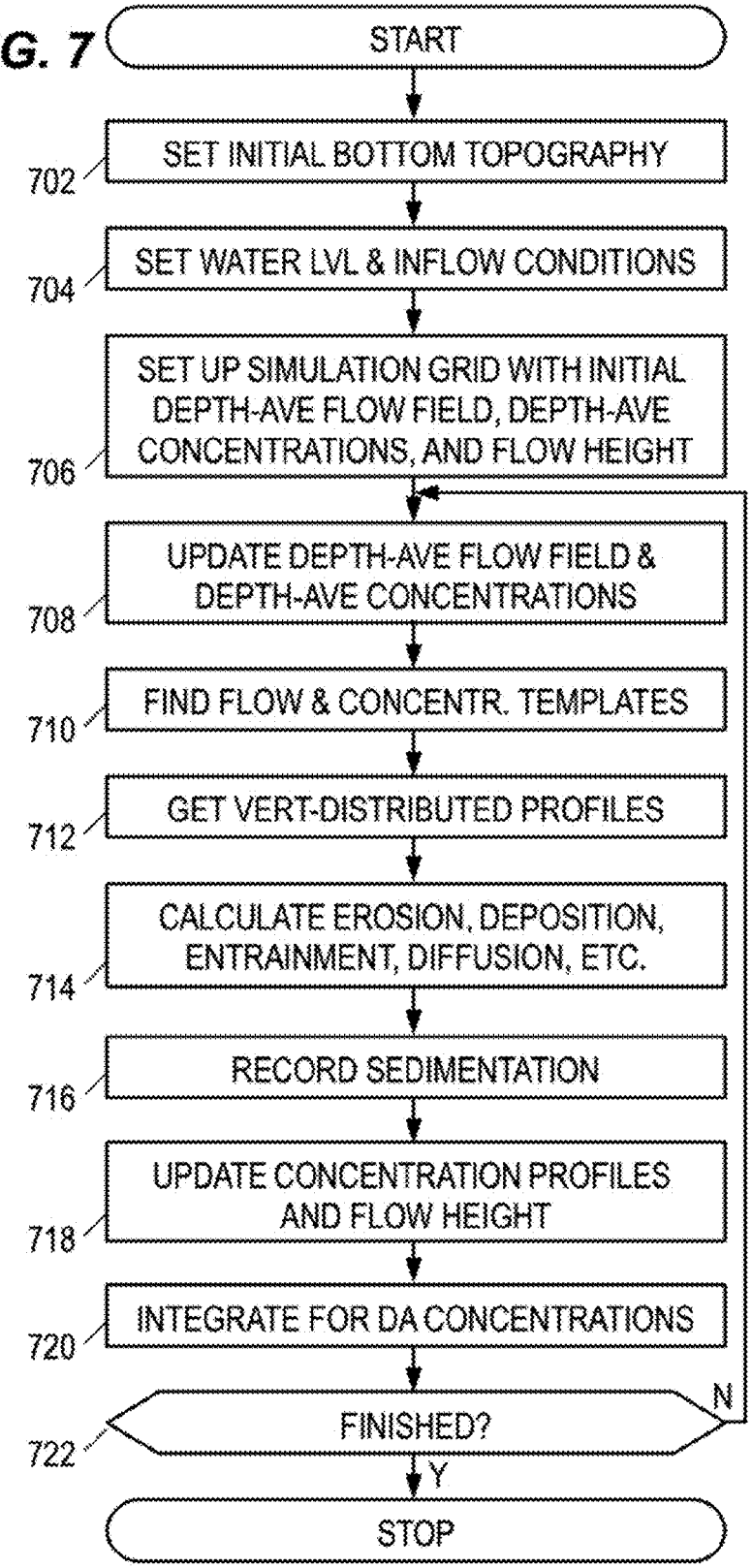
FIG. 7 is a flowchart of an illustrative depth-averaged flow simulation method having sediment transport determined via parameterized templates for depth profiling.

FIG. 7 shows an illustrative simulation method that may be implemented by the illustrative simulation system disclosed further below. The method begins in block 702 with setting up the geologic model space with an initial bottom topography. The bottom topography may be determined by identifying a stratigraphic surface in a three-dimensional seismic data volume by methods familiar to persons of ordinary skill in the art, who will also recognize other methods for identifying or inferring the geometry of a stratigraphic surface. Such other methods include, but are not limited to interpretation of two-dimensional seismic lines, other remote imaging techniques, correlating well logs, and spatially correlating outcrop observations. Allowances may be made to correct for changes in paleoslope or other geologic deformation of the interpreted surface.

In block 704, the user sets the simulation parameters relating to water level and inflow conditions, including the estimated inlet locations and associated flow rates and sedimentary burdens as a function of time. These parameters may be based on the interpreted paleoflow direction determined by a seismic interpreter according to methods familiar to persons of ordinary skill in the art. Some trial and error may be employed using multiple simulations to refine the initial parameter values. Such methods may similarly be employed in block 706 to set up the model space grid and provide initial values for the depth-averaged flow velocity, depth average sediment concentration for each class of grain size, the flow height, and the center of gravity for the sediment-laden fluid column. With the programmed templates, these initial values also provide for initial vertically-distributed profiles of velocity and sediment concentrations at each map point.

The system then iterates through the loop of blocks 708-722 until a stopping condition is reached. Typically, the stopping condition coincides with the number of time steps needed to simulate the desired geologic time span, but other conditions are also suitable, including reaching a target deposition depth, and exceeding a mismatch threshold relative to a target geological structure, or by visual inspections by users through an computer graphic user-interface.

In block 708, the system applies the flow equations to the various current parameter values (the depth averaged flow velocity field, the depth averaged sediment concentration for each class of grain size at each map point, the center of gravity, the flow height, the bottom topography, and the inflow and other boundary conditions) to simulate a time step forward and the resulting depth averaged flow velocity, depth averaged sediment concentrations, center of gravity, and flow height associated with the new time.

In block 710, the system takes the depth averaged flow velocity, depth averaged sediment concentrations for the various grain size classes, center of gravity, and flow height, at each map point as parameter values to determine the associated flow template and sediment concentration template(s). Other parameters, such as depth-averaged turbulent kinetic energy and depth-averaged turbulent dissipation, may also be used to determine the templates. In block 712, these templates are applied to the depth averaged flow velocity and depth averaged sediment concentrations to get the vertically-distributed flow profiles and vertically-distributed sediment concentration profiles for each map point.

These profiles, taken together, represent the 3D flow velocity field and 3D sediment concentration fields. These fields are employed in block 714 to calculate the flux of the fluid and the sediment in each grain size class, including the effects of various phenomena such as bed shear stress, turbulent kinetic energy dissipation and diffusion, erosion rates for various classes of grain size, deposition rates for various classes of grain size, changes to the bottom topography derived from erosion and deposition, and changes to flow height due to entrainment and detrainment. By addressing these phenomena in the three dimensional domain, it is expected that the simulator will be better able to account for the velocity-dependent settling rate of differing grain sizes, the shear-dependent effects of turbulent diffusion, the concentration-dependent effects of flocculation and particle interactions, and those parameters having combined dependencies such as erosion and deposition.

In block 716, the net sediment deposition (of each grain size) for each map point is calculated and recorded. This calculation may be based not only on the 3D flow and concentration fields at the given map point, but also on the spatial and/or time derivative of those fields. Some combination of parameters is tracked within each cell of the model to enable later property determination of any resulting geobodies. Among the tracked parameters may be the net mass or volume of each grain size that is deposited at each time step, enabling later determination of geobody deposition rate and age.

In block 718, the divergence of the fluid and sediment fluxes are calculated and used to update the sediment concentration and flow velocity profiles. Such updating may further account for the bottom topography, including the bottom slope, for that map point at the given time step.

In block 720, the system integrates the updated sediment concentration profile of each class of grain size to obtain the depth-averaged sediment concentrations and the updated center of gravity Similarly, the flow velocity profiles are integrated to obtain the depth-averaged flow velocity components at each map point.

In block 722, the simulator determines whether a stopping condition has been reached, and if so, the method halts.

Figure 8:
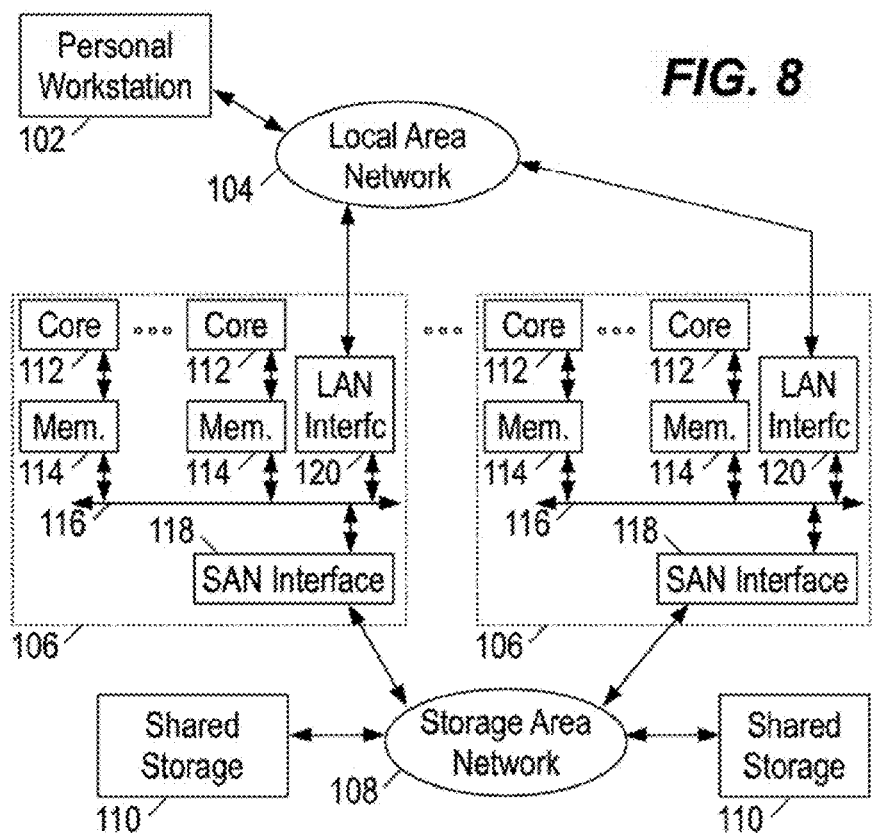
FIG. 8 is an illustrative depth-averaged flow simulation system.

FIG. 8 shows one illustrative simulation system for implementing the method of FIG. 7. It includes a personal workstation 102 coupled via a local area network (LAN) 104 to one or more multi-processor computers 106, which are in turn coupled via a storage area network (SAN) 108 to one or more shared storage units 110. Personal workstation 102 serves as a user interface to the simulation system, enabling a user to load data into the system, to configure and monitor the operation of the system, and to retrieve the results (often in the form of image data) from the system. Personal workstation 102 may take the form of a desktop computer with a graphical display that graphically shows representations of the input and result data, and with a keyboard that enables the user to move files and execute processing software. LAN 104 provides high-speed communication between multi-processor computers 106 and with personal workstation 102. The LAN 104 may take the form of an Ethernet network.

Multi-processor computer(s) 106 provide parallel processing capability to enable suitably prompt processing of the input data to derive the results data. Each computer 106 includes multiple processors 112, distributed memory 114, an internal bus 116, a SAN interface 118, and a LAN interface 120. Each processor 112 operates on allocated tasks to solve a portion of the overall problem and contribute to at least a portion of the overall results. Associated with each processor 112 is a distributed memory module 114 that stores application software and a working data set for the processor's use. Internal bus 116 provides inter-processor communication and communication to the SAN or LAN networks via the corresponding interfaces 118, 120. Communication between processors in different computers 106 can be provided by LAN 104.

SAN 108 provides high-speed access to shared storage devices 110. The SAN 108 may take the form of, e.g., a Fibrechannel or Infiniband network. Shared storage units 110 may be large, stand-alone information storage units that employ magnetic disk media for nonvolatile data storage. To improve data access speed and reliability, the shared storage units 110 may be configured as a redundant disk array ("RAID").

Figure 9:
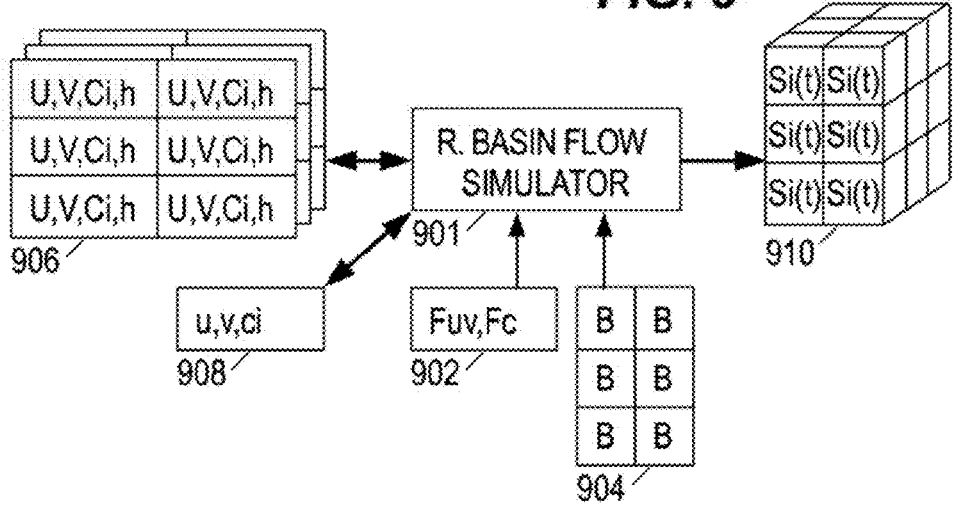
FIG. 9 is an illustrative software flow diagram.

The processors 112 cooperatively execute the simulator software 901 shown in FIG. 9. The software 901 accesses one of the shared storage devices to retrieve the library of templates 902 and the initial simulation parameters 904 (including bottom topography, inflow and boundary conditions). The software 901 then generates initial and subsequent parameter values 906 for the two dimensional depth-averaged model space, including depth averaged flow velocity components, depth averaged sediment concentration for the range of grain size classes, center of gravity, and flow height. At each time step, vertically-distributed flow velocity and sediment concentration profiles 908 are determined for use in simulating various deposition-related effects, before being translated back into depth-averaged model space for moving forward to the next time step. The software 901 generates a record, for each cell, of the sediment deposited in that cell as a function of time 910.

Though Cartesian coordinates have been employed for the foregoing explanation, other coordinate systems are also suitable and may be employed. Numerous other variations and modifications will become apparent to those skilled in the art once the above disclosure is fully appreciated. It is intended that the following claims be interpreted to embrace all such variations and modifications.

What is claimed is:

1. A method, comprising:
   providing a model of a sedimentary basin by:
   (a) determining at each map point a flow template and at least one sediment concentration template based on:
   a depth-averaged flow velocity and
   one or more depth-averaged sediment concentrations for associated classes of grain size, each of said depth-averaged flow velocity and one or more depth-averaged sediment concentrations being for that map point at a given time step;
   (b) applying at each map point the flow template to the depth-averaged flow velocity and the at least one sediment concentration template to the one or more depth-averaged sediment concentrations to obtain a vertically-distributed flow velocity profile and one or more vertically-distributed sediment concentration profiles for that map point, thereby reconstructing a 3D flow velocity field and one or more 3D sediment concentration fields for associated classes of grain size at the given time step;
   (c) using the 3D flow velocity field and the one or more 3D sediment concentration fields to calculate at each map point a fluid flux and one or more sediment fluxes for associated classes of grain size;
   (d) updating at each map point the flow velocity profile and the one or more sediment concentration profiles based on a divergence of the fluid flux and one or more divergences of the one or more sediment fluxes at that map point at the given time step;
   (e) computing at each map point the depth-averaged flow velocity and the one or more depth-averaged sediment concentrations by integrating the flow velocity profile and the one or more sediment concentration profiles for that map point at the given time step, thereby obtaining an updated 2D flow velocity field and an updated one or more 2D sediment concentration fields;
   (f) deriving from the one or more sediment concentration profiles a center of gravity for each map point; and
   (g) solving a set of two-dimensional flow equations based on the updated 2D flow velocity field, the updated one or more 2D sediment concentration fields, the center of the gravity, and flow height, to calculate, at each map point, the depth-averaged flow velocity at a next time step;
   evaluating the sedimentary basin using the model; and
   drilling a well at a location based on the evaluation.

2. The method of claim 1, further comprising taking the next time step as the given time step and repeating said operations of determining, applying, using, updating, computing, deriving, and solving.

3. The method of claim 1, wherein said at least one sediment concentration template is one of multiple grain-size specific sediment concentration templates determined for that map point and applied to respective depth-averaged sediment concentrations for different classes of grain size that map point.

4. The method of claim 1, wherein said calculating one or more sediment fluxes accounts for flow velocity profile, bed shear stress, erosion, sediment deposition, clear water entrainment/detrainment, turbulent kinetic energy dissipation, and diffusion.

5. The method of claim 1, further comprising:
   estimating at each map point a rate of erosion or deposition based on the flow velocity profile and sediment concentration profile for at least one class of grain sizes for that map point at the given time step; and
   updating at each map point a flow height based at least in part on the estimated rate of erosion or deposition for that map point at the given time step.

6. The method of claim 5, wherein said templates are further determined based on the flow height for that map point at the given time step.

7. The method of claim 1, wherein said determining is further based on depth-averaged turbulent kinetic energy and depth-averaged turbulent dissipation at that map point.

8. The method of claim 1, wherein said updating is further based on bottom topography, including bottom slope, for that map point at the given time step.

9. The method of claim 1, wherein said solving the set of two-dimensional flow equations further calculates at each map point the one or more depth-averaged sediment concentrations at a next time step.

10. A method, comprising:
    providing a model of a sedimentary basin by:
    (a) determining at each map point a flow template and at least one sediment concentration template based on:
    a depth-averaged flow velocity and
    one or more depth-averaged sediment concentrations for associated classes of grain size, each of said depth-averaged flow velocity and one or more depth-averaged sediment concentrations being for that map point at a given time step;
    (b) applying at each map point the flow template to the depth-averaged flow velocity and the at least one sediment concentration template to the one or more depth-averaged sediment concentrations to obtain a vertically-distributed flow velocity profile and one or more vertically-distributed sediment concentration profiles for that map point, thereby reconstructing a 3D flow velocity field and one or more 3D sediment concentration fields for associated classes of grain size at the given time step;
(c) using the 3D flow velocity field and the one or more 3D sediment concentration fields to calculate at each map point a fluid flux and one or more sediment fluxes for associated classes of grain size;
(d) updating at each map point the flow velocity profile and the one or more sediment concentration profiles based on a divergence of the fluid flux and one or more divergences of the one or more sediment fluxes at that map point at the given time step;
(e) computing at each map point the depth-averaged flow velocity and the one or more depth-averaged sediment concentrations by integrating the flow velocity profile and the one or more sediment concentration profiles for that map point at the given time step, thereby obtaining an updated 2D flow velocity field and an updated one or more 2D sediment concentration fields;
(f) deriving from the one or more sediment concentration profiles a center of gravity for each map point;
(g) solving a set of two-dimensional flow equations based on the updated 2D flow velocity field, the updated one or more 2D sediment concentration fields, the center of the gravity, and flow height, to calculate, at each map point, the depth-averaged flow velocity at a next time step;
(h) estimating at each map point a net sediment deposition based on the flow velocity profile and the one or more sediment concentration profiles for that map point at the given time step; and
(i) recording, as a function of time for each map point and depth, at least one property in the group: net deposition rate for each of one or more grain size bins, deposited sediment volume for each of one or more grain size bins, a grain size distribution, sediment type, and bedding surface;

evaluating the sedimentary basin using the model; and
drilling a well at a location based on the evaluation,
wherein said estimating is further based on the flow velocity profile and the one or more sediment concentration profiles of adjacent map points.

11. A method, comprising:
providing a model of a sedimentary basin by:
(a) determining at each map point a flow template and at least one sediment concentration template based on:
a depth-averaged flow velocity and
one or more depth-averaged sediment concentrations for associated classes of grain size, each of said depth-averaged flow velocity and one or more depth-averaged sediment concentrations being for that map point at a given time step;
(b) applying at each map point the flow template to the depth-averaged flow velocity and the at least one sediment concentration template to the one or more depth-averaged sediment concentrations to obtain a vertically-distributed flow velocity profile and one or more vertically-distributed sediment concentration profiles for that map point, thereby reconstructing a 3D flow velocity field and one or more 3D sediment concentration fields for associated classes of grain size at the given time step;
(c) using the 3D flow velocity field and the one or more 3D sediment concentration fields to calculate at each map point a fluid flux and one or more sediment fluxes for associated classes of grain size;
(d) updating at each map point the flow velocity profile and the one or more sediment concentration profiles based on a divergence of the fluid flux and one or more divergences of the one or more sediment fluxes at that map point at the given time step;
(e) computing at each map point the depth-averaged flow velocity and the one or more depth-averaged sediment concentrations by integrating the flow velocity profile and the one or more sediment concentration profiles for that map point at the given time step, thereby obtaining an updated 2D flow velocity field and an updated one or more 2D sediment concentration fields;
(f) deriving from the one or more sediment concentration profiles a center of gravity for each map point; and
(g) solving a set of two-dimensional flow equations based on the updated 2D flow velocity field, the updated one or more 2D sediment concentration fields, the center of the gravity, and flow height, to calculate, at each map point, the depth-averaged flow velocity at a next time step;

evaluating the sedimentary basin using the model; and
drilling a well at a location based on the evaluation,
wherein each flow and concentration template is expressible as $$f\left(U(x, y), V(x, y), C_i(x, y), \frac{z}{h(x, y)}\right),$$

with the constraint $$\frac{1}{h(x, y)} \int_0^{h(x,y)} f\left(U(x, y), V(x, y), C_i(x, y), \frac{z}{h(x, y)}\right) dz = 1,$$

where $U(x,y)$ and $V(x,y)$ represent components of the depth-averaged flow velocity as a function of position, $C_i(x,y)$ represent depth-averaged sediment concentration as a function of position for the ith grain size bin, and $h(x,y)$ represents flow height as a function of position.

12. A method, comprising:
providing a model of a sedimentary basin by:
(a) determining at each map point a flow template and at least one sediment concentration template based on:
a depth-averaged flow velocity and
one or more depth-averaged sediment concentrations for associated classes of grain size, each of said depth-averaged flow velocity and one or more depth-averaged sediment concentrations being for that map point at a given time step;
(b) applying at each map point the flow template to the depth-averaged flow velocity and the at least one sediment concentration template to the one or more depth-averaged sediment concentrations to obtain a vertically-distributed flow velocity profile and one or more vertically-distributed sediment concentration profiles for that map point, thereby reconstructing a 3D flow velocity field and one or more 3D sediment concentration fields for associated classes of grain size at the given time step;
(c) using the 3D flow velocity field and the one or more 3D sediment concentration fields to calculate at each map point a fluid flux and one or more sediment fluxes for associated classes of grain size;
(d) updating at each map point the flow velocity profile and the one or more sediment concentration profiles based on a divergence of the fluid flux and one or more divergences of the one or more sediment fluxes at that map point at the given time step;

(e) computing at each map point the depth-averaged flow velocity and the one or more depth-averaged sediment concentrations by integrating the flow velocity profile and the one or more sediment concentration profiles for that map point at the given time step, thereby obtaining an updated 2D flow velocity field and an updated one or more 2D sediment concentration fields;

(f) deriving from the one or more sediment concentration profiles a center of gravity for each map point;

(g) solving a set of two-dimensional flow equations based on the updated 2D flow velocity field, the updated one or more 2D sediment concentration fields, the center of the gravity, and flow height, to calculate, at each map point, the depth-averaged flow velocity at a next time step;

(h) estimating at each map point a net sediment deposition based on the flow velocity profile and the one or more sediment concentration profiles for that map point at the given time step; and (i) recording, as a function of time for each map point and depth, at least one property in the group: net deposition rate for each of one or more grain size bins, deposited sediment volume for each of one or more grain size bins, a grain size distribution, sediment type, and bedding surface;

evaluating the sedimentary basin using the model; and drilling a well at a location based on the evaluation, wherein said estimating is further based on a temporal rate of change of the flow velocity profile and the one or more sediment concentration profiles for that map point at the given time step.

13. A method, comprising:

providing a model of a sedimentary basin by:

(a) determining at each map point a flow template and at least one sediment concentration template based on:

a depth-averaged flow velocity and one or more depth-averaged sediment concentrations for associated classes of grain size, each of said depth-averaged flow velocity and one or more depth-averaged sediment concentrations being for that map point at a given time step;

(b) applying at each map point the flow template to the depth-averaged flow velocity and the at least one sediment concentration template to the one or more depth-averaged sediment concentrations to obtain a vertically-distributed flow velocity profile and one or more vertically-distributed sediment concentration profiles for that map point, thereby reconstructing a 3D flow velocity field and one or more 3D sediment concentration fields for associated classes of grain size at the given time step;

(c) using the 3D flow velocity field and the one or more 3D sediment concentration fields to calculate at each map point a fluid flux and one or more sediment fluxes for associated classes of grain size;

(d) updating at each map point the flow velocity profile and the one or more sediment concentration profiles based on a divergence of the fluid flux and one or more divergences of the one or more sediment fluxes at that map point at the given time step;

(e) computing at each map point the depth-averaged flow velocity and the one or more depth-averaged sediment concentrations by integrating the flow velocity profile and the one or more sediment concentration profiles for that map point at the given time step, thereby obtaining an updated 2D flow velocity field and an updated one or more 2D sediment concentration fields;

(f) deriving from the one or more sediment concentration profiles a center of gravity for each map point;

(g) solving a set of two-dimensional flow equations based on the updated 2D flow velocity field, the updated one or more 2D sediment concentration fields, the center of the gravity, and flow height, to calculate, at each map point, the depth-averaged flow velocity at a next time step;

(h) estimating at each map point a net sediment deposition based on the flow velocity profile and the one or more sediment concentration profiles for that map point at the given time step; and (i) recording, as a function of time for each map point and depth, at least one property in the group: net deposition rate for each of one or more grain size bins, deposited sediment volume for each of one or more grain size bins, a grain size distribution, sediment type, and bedding surface;

evaluating the sedimentary basin using the model; and drilling a well at a location based on the evaluation, wherein said estimating is further based on a temporal and spatial rate of change of the flow velocity profile and the one or more sediment concentration profiles for that map point at the given time step.

* * * * *